United States Patent [19]

Renoult et al.

[11] Patent Number: 4,600,900

[45] Date of Patent: Jul. 15, 1986

[54] PIEZOELECTRIC OSCILLATOR HAVING FILTERS TO PREVENT UNWANTED MODES

[75] Inventors: Patrick Renoult, Paris; Gérard Marotel, Sartrouville, both of France

[73] Assignee: Compagnie d'Electronique et de Piezo-Electricite, Argenteuil, France

[21] Appl. No.: 715,833

[22] Filed: Mar. 25, 1985

[30] Foreign Application Priority Data

Mar. 27, 1984 [FR] France ............... 84 04747

[51] Int. Cl.⁴ ........................... H03B 5/36
[52] U.S. Cl. ........................ 331/116 R; 331/162
[58] Field of Search ............ 331/116 R, 116 FE, 162, 331/158

[56] References Cited

U.S. PATENT DOCUMENTS 4,484,157 11/1984 Helle et al. .................. 331/116 R

FOREIGN PATENT DOCUMENTS 2501435 3/1981 France .

OTHER PUBLICATIONS

Siemens Zeitschrift, vol. 49, No. 5, 1975, (Erlangen, DE), H. J. Forster: "Temperatur-Kompensierte Quarzoszillatoren fur den Frequenzbereich 2 bis 60 MHz", pp. 328-332.

Primary Examiner—Siegfried H. Grimm
Attorney, Agent, or Firm—Oblon, Fisher, Spivak, McClelland & Maier

[57] ABSTRACT

A piezoelectric oscillator of the Clapp type for operation in the overtone mode comprises a piezoelectric resonator having a C-mode resonance frequency at which the oscillator is designed to operate, the resonator being connected between the base of a transistor and ground. A capacitive voltage-dividing bridge is also connected between the base of the transistor and ground, the so-called midpoint of the bridge being connected to the emitter of the transistor. A quartz crystal and an inductance coil decoupled by a capacitor are placed between the emitter of the transistor and ground. The inductance coil and the capacitor form a high-pass filter for attenuating frequencies below the resonance frequency. The piezoelectric resonator is tuned to the mode B which is adjacent to the mode C in order to eliminate the unwanted mode B.

4 Claims, 3 Drawing Figures

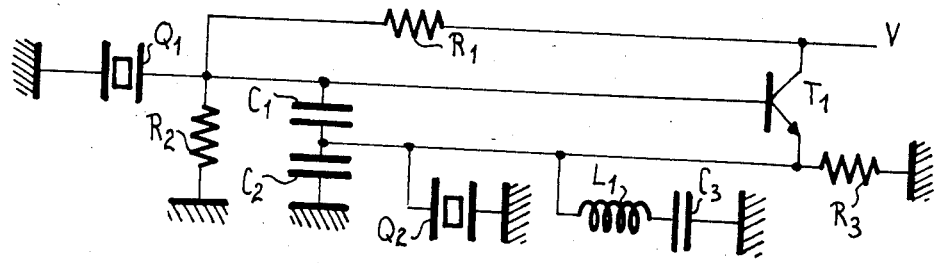
FIG_1
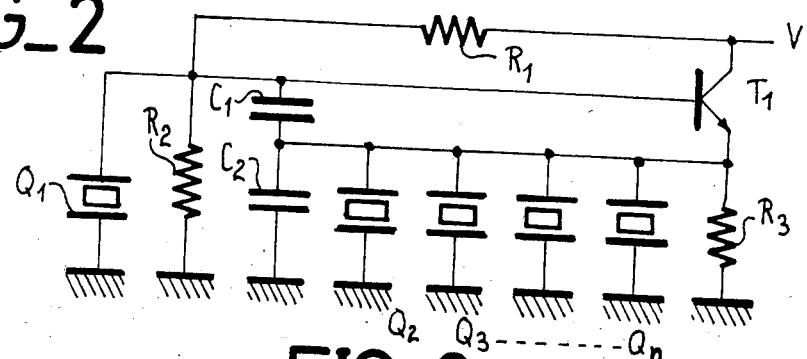
FIG_2
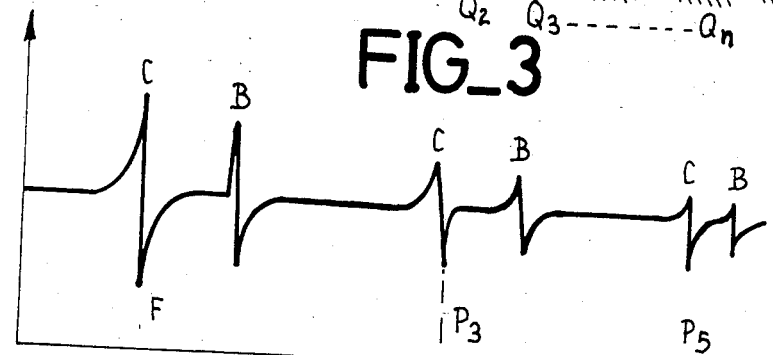
FIG_3

PIEZOELECTRIC OSCILLATOR HAVING FILTERS TO PREVENT UNWANTED MODES

BACKGROUND OF THE INVENTION

1. Field of the Invention

This invention relates to a piezoelectric oscillator of the Clapp type which operates in the overtone mode.

2. Description of the Prior Art

There has already been described in U.S. Pat. No. 4,484,157 granted to the present Applicant a piezoelectric oscillator of the Clapp type which operates in the overtone mode and comprises a piezoelectric resonator having a resonance frequency at which the oscillator is designed to operate, said resonator being connected between the base of a transistor and ground, as well as a capacitive voltage-dividing bridge having a so-called midpoint, the emitter of the transistor being loaded through a load resistor.

SUMMARY OF THE INVENTION

The invention is directed to an oscillator of the aforementioned type which offers enhanced selectivity by means of selective filtering.

In a first embodiment, filtering is of the high-pass and band-rejection type and the oscillator comprises in parallel between the midpoint and ground on the one hand an inductance coil forming with the capacitor of the capacitive bridge placed between the midpoint and ground a high-pass filter for attenuating frequencies which are lower than said resonance frequency and on the other hand a piezoelectric resonator tuned to a second frequency mode which is higher than said resonance frequency in order to eliminate said mode.

Said frequency mode which is higher than said resonance frequency can be a partial of higher rank in the case of a single-rotation cut, or a mode of the same partial in the case of a double-rotation or triple-rotation cut, that is, in the case of an SC-cut, for example, the mode B adjacent to the mode C which is employed as resonance frequency.

In a second embodiment, band-rejection filtering is performed and the oscillator essentially comprises a plurality of piezoelectric resonators tuned to the unwanted modes and connected in parallel between said midpoint and ground.

BRIEF DESCRIPTION OF THE DRAWINGS

Other features of the invention will be more apparent upon consideration of the following description and accompanying drawings, wherein:

FIG. 1 represents the first embodiment of the invention in the case of an SC-cut (double rotation);

FIG. 2 represents the second embodiment of the invention;

FIG. 3 illustrates the open-loop response of the oscillator as a function of the frequency F and corresponding to the case of FIG. 1.

DESCRIPTION OF THE PREFERRED EMBODIMENTS

As shown in FIG. 1, the oscillator comprises a transistor $T_1$ which is biased with a voltage V applied to the collector and with a fraction of this voltage applied to the base via a dividing bridge $R_1$ and $R_2$. Between the base and ground is placed a capacitive voltage-dividing bridge $C_1$, $C_2$, the so-called midpoint of which is connected to the emitter of the transistor $T_1$. The emitter is loaded through a resistor $R_3$ placed between this latter and ground. An SC-cut quartz crystal $Q_1$ having a C-mode resonance frequency (third partial) at which the oscillator is intended to operate is connected between the base of the transistor and ground. The high-pass filtering function is performed by an inductance coil $L_1$ placed between said midpoint and ground. A capacitor $C_3$ decouples the inductance coil $L_1$ on the ground side. The parameters of the high-pass function are determined by the value of the inductance coil $L_1$ and of the capacitor $C_2$. Particularly in FIG. 3, the oscillator operates in mode C of the third partial by eliminating mode B. The inductance coil $L_1$ and capacitor $C_2$ are chosen so as to ensure that the amplifier gain curve falls below the frequency of the third partial so as to eliminate the fundamental F which comprises a mode B and a mode C. The fifth partial is eliminated by the natural drop in the gain of amplifier $T_1$. Mode B of the third partial is eliminated by a resonator $Q_2$ which is connected between the midpoint and ground and which has a mode at the frequency of mode B of the third partial of the resonator $Q_1$. This frequency corresponds to a quality factor (Q-factor) which is considerably lower than that of mode B of the third partial of the resonator $Q_1$ in a ratio which is preferably between 30 and 1000 times.

Under these conditions, the Barkhausen gain condition of the oscillator is satisfied in the case of mode C of the third partial. It will be noted that, below the frequency of mode C of the third partial of the resonator $Q_1$, the amplifier gain increases to some extent but this does not give rise to any practical disadvantages by reason of the fact that a resonance frequency on which the oscillator would be liable to lock is not present in this region.

In FIG. 2, the high-pass function performed by the inductance coil $L_1$ is replaced by a plurality of band-rejection point functions $Q_3 \ldots Q_n$ produced by resonators having frequencies which correspond to the unwanted modes of the quartz crystal $Q_1$ in order to perform the function previously carried out by the inductance coil $L_1$. The Q-factor of the selected frequencies of the resonators $Q_2$ to $Q_n$ is of the order of 30 to 1000 times lower than those of the corresponding modes to be eliminated. This form of construction permits more effective elimination of the unwanted partials which could have high Q-factors and consequently peaks corresponding to low insertion losses.

What is claimed is:

1. A piezoelectric oscillator of the Clapp type for operation in the overtone mode in which provision is made for a first piezoelectric resonator having a resonance frequency at which the oscillator is designed to operate, said resonator being connected between the base of a transistor and ground, a capacitive voltage-dividing bridge being connected between the base of said transistor and ground and having a midpoint connected to the emitter of said transistor, the emitter of said transistor being loaded through a load resistor, comprising in parallel between said midpoint and ground on the one hand an inductance coil forming a high-pass filter with the capacitor of the capacitive bridge placed between the midpoint and ground, the function of said high-pass filter being to attenuate frequencies below said resonance frequency, and on the other hand a second piezoelectric resonator tuned to a frequency mode which is higher than said resonance frequency in order to eliminate said mode.

2. An oscillator according to claim 1, wherein the first resonator is an SC-cut quartz crystal, and wherein said resonance frequency is the mode C of the third partial and said mode to be eliminated is the mode B of the third partial.

3. A piezoelectric oscillator of the Clapp type for operation in the overtone mode in which provision is made for a first piezoelectric resonator having a resonance frequency at which the oscillator is designed to operate, said resonator being connected between the base of a transistor and ground, a capacitive voltage-dividing bridge being connected between the base of said transistor and ground and having a midpoint connected to the emitter of said transistor, the emitter of said transistor being loaded through a load resistor, comprising a plurality of piezoelectric resonators tuned to the unwanted modes of said first resonator and connected in parallel between said midpoint and ground.

4. An oscillator according to claim 3, wherein the first resonator is an SC-cut quartz crystal and wherein said resonance frequency is the mode C of the third partial.

* * * * *